(12) United States Patent
Roy

(10) Patent No.: US 12,346,796 B2
(45) Date of Patent: Jul. 1, 2025

(54) ARTIFICIAL INTELLIGENCE HARDWARE WITH SYNAPTIC REUSE

(71) Applicant: International Business Machines Corporation, Armonk, NY (US)

(72) Inventor: Subhrajit Roy, Melbourne (AU)

(73) Assignee: International Business Machines Corporation, Armonk, NY (US)

( * ) Notice: Subject to any disclaimer, the term of this patent is extended or adjusted under 35 U.S.C. 154(b) by 922 days.

(21) Appl. No.: 16/592,130

(22) Filed: Oct. 3, 2019

(65) Prior Publication Data
US 2021/0103801 A1   Apr. 8, 2021

(51) Int. Cl.
G06N 3/063   (2023.01)
G06N 3/08    (2023.01)
G06N 20/00   (2019.01)
H03G 3/30    (2006.01)

(52) U.S. Cl.
CPC ........... *G06N 3/063* (2013.01); *G06N 3/08* (2013.01); *G06N 20/00* (2019.01); *H03G 3/30* (2013.01)

(58) Field of Classification Search
CPC .......... G06N 3/063; G06N 20/00; G06N 3/08; H03G 3/30
See application file for complete search history.

(56) References Cited

U.S. PATENT DOCUMENTS

| | | |
|---|---|---|
| 5,343,555 A | 8/1994 | Yayla et al. |
| 10,019,470 B2 | 7/2018 | Birdwell et al. |
| 10,147,035 B2 * | 12/2018 | Cruz-Albrecht ....... G06N 3/049 |
| 10,248,675 B2 | 4/2019 | Birdwell et al. |
| 10,306,971 B2 | 6/2019 | Zhang |
| 10,346,347 B2 | 7/2019 | Lu et al. |
| 10,360,971 B1 | 7/2019 | Hokenmaier et al. |
| 10,885,425 B2 | 1/2021 | Imam et al. |

(Continued)

FOREIGN PATENT DOCUMENTS

| | | |
|---|---|---|
| CN | 104662526 A | 5/2015 |
| CN | 105659261 A | 6/2016 |

(Continued)

OTHER PUBLICATIONS

Furber, S., et al., Overview of the SpiNNaker System Architecture, [received Mar. 7, 2024]. Retrieved from Internet :< (Year: 2012).*

(Continued)

*Primary Examiner* — Miranda M Huang
*Assistant Examiner* — Bart I Rylander
(74) *Attorney, Agent, or Firm* — Patterson + Sheridan, LLP

(57) ABSTRACT

Synaptic reuse allows for a plurality of artificial neurons to be associated with corresponding pluralities of artificial synapses and variable gain amplifiers, to thereby use less space and fewer components to implement and less power to operate than neurons having dedicated paths for each input source. To reduce the likelihood of signal collision, and allow for the independent control and interpretation of input spikes, a router is configured to connect input sources to each of the plurality of artificial neurons in conjunction with a gain configuration controller that is configured to set a gain on each of the plurality of variable gain amplifiers based on a time division schema and an identity of an input source transmitting a spike during a given time.

20 Claims, 14 Drawing Sheets

(56) References Cited

U.S. PATENT DOCUMENTS

| | | |
|---|---|---|
| 2014/0032460 A1 | 1/2014 | Cruz-Albrecht et al. |
| 2015/0112909 A1 | 4/2015 | Wierzynski et al. |
| 2018/0005108 A1 | 1/2018 | Cruz-Albrecht et al. |
| 2018/0089557 A1* | 3/2018 | Kumar .................. G06N 3/063 |
| 2021/0103801 A1 | 4/2021 | Roy |

FOREIGN PATENT DOCUMENTS

| | | |
|---|---|---|
| CN | 107622303 A | 1/2018 |
| CN | 109816102 A | 5/2019 |
| JP | 2016537711 A | 12/2016 |
| JP | 2018136919 A | 8/2018 |
| WO | 2015057302 A2 | 4/2015 |
| WO | 2018047213 A1 | 3/2018 |

OTHER PUBLICATIONS

Wu, Y., et al., Spatio-Temporal Backpropagation for Training High-Performance Spiking Neural Networks, [received Oct. 5, 2022]. Retrieved from Internet:< https://www.frontiersin.org/articles/10.3389/fnins.2018.00331/full> (Year: 2018).*

Albrecht, et al., A scalable neural chip with synaptic electronics using CMOS integrated memristors, [received Jul. 19, 2024]. Retrieved from Internet:<https://iopscience.iop.org/article/10.1088/0957-4484/24/38/384011/meta> (Year: 2013).*

PCT Notification of Transmittal of the International Search Report and the Written Opinion of the International Searching Authority, or the Declaration for Appliation No. PCT/IB2020/058760 dated Jan. 15, 2021.

Wang et al., "A Neuromorphic Implementation of Multiple Spike-Timing Synaptic Plasticity Rules For Large-Scale Neural Networks," Frontiers in Neuroscience, May 20, 2015, 17 pages.

Frenkel et al., "A 0.086-mm2 12.7-pJ/SOP 64k-Synapse 256-Neuron Online-Learning Digital Spiking Neuromorphic Processor in 28nm CMOS," arXiv:1804.07858v3 [cs.ET] Nov. 10, 2018, 14 pages.

Disclosed Anonymously, "Method and apparatus detailing new intelligence within an application to generate user specific output for real memory analysis," IP.com No. IPCOM000212710D, Nov. 23, 2011, 6 pages.

Disclosed Anonymously, "New Invented artificial intelligence process model and Prediction of assets' future values with that,"IP.com No. IPCOM000259423D, Aug. 10, 2019, 5 pages.

Intellectual Property Office, Examination Report for Application GB2206298.8 dated Nov. 21, 2023.

Australian Government IP Australia, Notice of Acceptance for Patent Application for Application 2020358928 dated Oct. 26, 2023.

Response to Examination Report filed in the U.K. Intellectual Property Office for UK Patent Application No. 2206298.8, dated Jan. 18, 2024.

Japanese Patent Office, Notice of Reasons for Refusal for Japanese Patent Application No. 2022-520174, dated Jan. 30, 2024.

Australian Government, Examination Report No. 1 for Standard Patent Application 2020358928 dated Jan. 30, 2023.

Intellectual Property Office of Singapore, "Invitation to Respond to Written Opinion," Jan. 29, 2025, 10 Pages, SG Application No. 11202202223R.

Benjamin, et al., Neurogrid: A mixed analog-digital multichip system for large-scale neural simulations, Proceedings of the IEEE, May 2014, vol. 102, No. 5, pp. 699-716.

Furber, et al., The Spinnaker Project: A Massivelyparallel Computer Architecture For Neural Simulations, Proceedings of the IEEE, May 2014, vol. 102, No. 5, pp. 652-665.

Merolla, et al., A Million Spiking Neuron Integrated Circuit With A Scalable Communication Network And Interface, Science, Aug. 8, 2014 vol. 345, No. 6197, pp. 668-673.

Qiao, et al., A Reconfigurable On-Line Learning Spiking Neuromorphic Processor Comprising 256 Neurons And 128k Synapses, Frontiers in Neuroscience, Apr. 29, 2015, vol. 9, Article 141, 17 pages.

The State Intellectual Property Office of People's Republic of China, "First Office Action", Mar. 29, 2025, 35Pages, CN Application No. 202080066499.X.

* cited by examiner

ARTIFICIAL INTELLIGENCE HARDWARE WITH SYNAPTIC REUSE

BACKGROUND

Artificial Neural Networks (ANN) are used in artificial intelligence applications to simulate the learning and recognition abilities of a natural brain using hardware and software modeled after the structures in the brain. In a neural network, various algorithms can be "taught" to perform various tasks through pattern recognition through a series of connected units or nodes that are referred to as neurons. These neurons internally share inputs and outputs with other neurons in the neural network via connections referred to as synapses. As the neural network is trained, various neurons are trained to provide different weights for different inputs that are received from various other neurons over these synapses.

Spiking Neural Networks (SNNs) are a third generation ANN that model the behavior of biological neural networks (i.e., the brains of animals) through the use of timed action potentials or "spikes" of information along a given synapse to convey information between two neurons. SNNs are considered to be more bio-realistic for modeling artificial intelligences, and are computationally more powerful than earlier generations of ANNs, while providing noise-robust, low-power, low-voltage implementations when integrated as hardware, such as on Very Large Scale Integrated (VLSI) circuits.

When modeling an SNN in hardware, to realize the rich non-linear dynamics of the SNN compared to earlier-generation ANNs, fabricators often need to use many more transistors (compared to sigmoidal neuron or perceptron based ANNs), which can lead to an increase in the total memory required to represent the SNN and corresponding increases in the power consumption of such hardware implementations. As the number of synapses typically outnumbers the number of neurons in an SNN, SNNs may require a large number of hardware components (e.g., transistors) to implement and requires a correspondingly large amount of space on a chip to pattern and place those hardware components. In addition to the greater space requirements to house the components, the additional components require more power to operate as the complexity of the SNN expands; leading to bulky, hard-to-manufacture, power hungry circuitry to implement an SNN.

SUMMARY

According to one embodiment of the present invention, a circuit is provided that includes: a plurality of artificial neurons; a plurality of artificial synapses, wherein each of the plurality of artificial synapses is associated with a corresponding one of the plurality of artificial neurons; a plurality of variable gain amplifiers, wherein each of the plurality of variable gain amplifiers is associated with a corresponding one of the plurality of artificial neurons; a router, configured to connect at least one of a plurality of input sources to each of the plurality of artificial neurons via a corresponding variable gain amplifier and a corresponding artificial synapse; and a gain configuration controller, configured to set a gain on each of the plurality of variable gain amplifiers based on a time division schema and an identity of an input source transmitting a spike during a given time to thereby use less space, fewer components to implement, and less power to operate that circuits that include multiple dedicated pathways between the input sources and the neurons defined therein.

In some aspects, in combination with any circuit described above or below, a number of input sources connected to a given artificial neuron of the plurality of artificial neurons is based on the time division schema and a spike transmission rate from the plurality of input sources to advantageously reduce the likelihood of signal collisions on a shared transmission pathway.

In some aspects, in combination with any circuit described above or below, the router and the gain configuration controller allow a first artificial neuron of the plurality of artificial neurons to receive a first spike from a first input source of the plurality of input sources at a first gain and a second artificial neuron of the plurality of artificial neurons to receive the first spike from the first input source of the plurality of input sources at a second gain set independently of the first gain to advantageously allow for different neurons to interpret the effect of an input source independently from one another.

In some aspects, in combination with any circuit described above or below, the router and the gain configuration controller allow a first artificial neuron of the plurality of artificial neurons to receive a first spike from a first input source of the plurality of input sources during a first time and a second artificial neuron of the plurality of artificial neurons to receive a second spike from a second input source of the plurality of input sources at the first time to advantageously allow for independent signal reception by different neurons from different signal sources.

In some aspects, in combination with any circuit described above or below, a first input source of the plurality of input sources transmits spikes at a first transmission rate and a second input source of the plurality of input sources transmits spikes at a second transmission rate, different from the first transmission rate to advantageously allow for the circuit to accept inputs from independently operated input sources.

In some aspects, in combination with any circuit described above or below, the router includes a register, configured to receive and store input spikes from the plurality of input sources and re-transmit the input spikes from the register based on the time division schema to advantageously reduce the likelihood of signal collisions on a shared transmission pathway.

In some aspects, in combination with any circuit described above or below, the router and the gain configuration controller are controlled via a shared clock signal to advantageously align the operations of the router and the gain configuration controller.

In some aspects, in combination with any circuit described above or below, each of the plurality of variable gain amplifiers is positioned upstream of a corresponding one artificial synapse relative to a corresponding artificial neuron to advantageously control how the synapse interprets an input based on the source from which the input is received.

In some aspects, in combination with any circuit described above or below, the plurality of artificial neurons, the plurality of artificial synapses, the plurality of variable gain amplifiers, the router, and the gain configuration controller are defined on a single integrated circuit to advantageously reduce signal delays and take more full advantage of the reduction in space usage offered by the circuit.

According to one embodiment of the present invention, a method is provided that includes: training neurons in a spiking neural network (SNN); assigning a time division schema for input sources to the neurons based on the training; assigning gains for the neurons in the time division schema based on the training; receiving inputs from the input sources; setting a given gain for a given neuron based on the assigned gains and a given input source from which a given input is received; and transmitting the given input to the given neuron according to the gain to thereby operate a circuit including neurons that use shared transmission pathways for one or more input sources that uses less space, fewer components to implement, and less power to operate that circuits including several dedicated pathways to input sources for a neuron defined therein.

In some aspects, in combination with any method described above or below, setting the given gain further comprises: setting the given gain based on an identity of a given input source from which the given input was received to advantageously allow the neurons to apply different weights to signals, based on the raining, while using a shared transmission pathway.

In some aspects, in combination with any method described above or below, a first neuron of the neurons receives a first input from a first input source of the input sources at a first gain, and a second neuron of the neurons receives the first input at a second gain different from the first gain to advantageously allow for different neurons to interpret the effect of an input source independently from one another.

In some aspects, in combination with any method described above or below, a first neuron of the neurons receives a first input from a first input source of the input sources at a first time and a second neuron of the neurons receives a second input from a second input source of the input sources at the first time to advantageously allow for independent signal reception by different neurons from different signal sources.

In some aspects, in combination with any method described above or below, the method further includes: storing the inputs received in a register until a corresponding time in the time division schema to advantageously use a time-based multiplexing schema for the shared transmission pathway.

In some aspects, in combination with any method described above or below, setting the given gain further comprises: setting the given gain based on the corresponding time being associated with a given input source from which the given input was received to advantageously use a time-based multiplexing schema for the shared transmission pathway.

In some aspects, in combination with any method described above or below, the method further includes: in response to receiving two input spikes from one input source of the input sources, dropping an earlier received input spike of the two input spikes from the one input source to advantageously reduce the effect or frequency of signal collisions on the shared transmission pathway.

In some aspects, in combination with any method described above or below, the method further includes: in response to receiving at least two input spikes during one time division for transmission to one neuron of the neurons, colliding the at least two input spikes to advantageously require less control hardware of software and to instead rely on the robustness of the SNN to ignore or compensate for signal collisions.

According to one embodiment of the present invention, a system is provided that includes: a signal path comprising a variable gain amplifier; an artificial neuron connected via the signal path to a plurality of input sources; and a gain configuration controller configured to set a gain in a variable gain amplifier based on which input source of the plurality of input sources is transmitting an input spike to the artificial neuron to advantageously allow the neuron to receive multiple inputs from multiple sources over a shared transmission pathway and thereby use less space, fewer components to implement, and less power to operate than neurons using several dedicated transmission pathways.

In some aspects, in combination with any system described above or below, the system further includes: a router, connected to the plurality of input sources and configured to connect one input source of the plurality of input sources at a time to the artificial neuron via the signal path to advantageously reduce the likelihood of signal collisions on a shared transmission pathway.

In some aspects, in combination with any system described above or below, the system further includes: a router, connected the gain configuration controller and the plurality of input sources, wherein the router is configured to identify to the gain configuration controller which input source of the plurality of input sources is transmitting the input spike to advantageously control which input spikes are routed to which neurons and the gains at which those input spikes are received based on the identity of the neuron and the input source.

DETAILED DESCRIPTION

The present disclosure provides for the implementation of an SNN (Spiking Neural Network) in hardware with reduced memory usage and chip area by reusing the synapses for multiple inputs into a neuron. Instead of provisioning X synapses for each neuron to receive up to X inputs, synaptic reuse allows for a neuron to receive X inputs using fewer than X synapses. In various embodiments, the neurons are each provided with a single input synapse to receive up to X inputs that share the transmission pathway of that synapse using Time Division Multiplexing (TDM) to regulate when and how spikes are received by the neuron. Accordingly, the reduction in the number of synapses implemented in hardware can lead to reductions in the space requirements, the number of components needed to be fabricated, and the power needed to drive those components.

Figure 1:
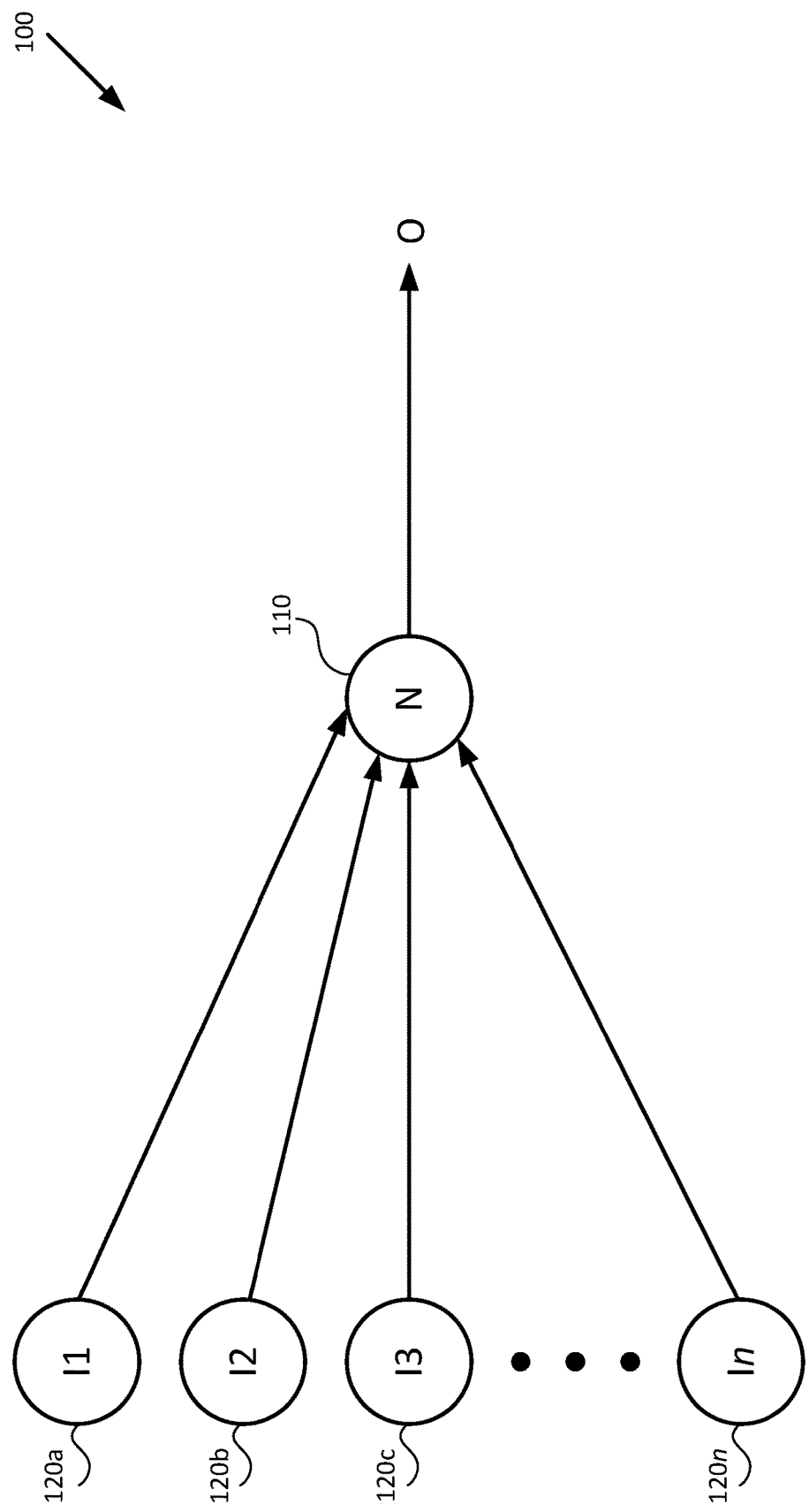
FIG. 1 illustrates an example neuron receiving inputs from several input sources, according to embodiments of the present disclosure.

FIG. 1 illustrates an example neuron 110 receiving inputs from n input sources 120a-n (generally, input source 120), according to embodiments of the present disclosure. Example circuitry of a neuron 110 is discussed in greater detail with regard to FIGS. 4A and 4B, although other circuitry can be used in various embodiments.

An input source 120 may be a neuron 110 in an earlier layer of an ANN (Artificial Neural Network), a direct feed for data input into the ANN (e.g., when the neuron 110 is in a first layer of the ANN), or a feedback input from another neuron 110 in the same or a later layer in the ANN. The neuron 110 receives various data from the input sources 120, which in an SNN are received as "spikes" when the action potential of the associated input source 120 is satisfied. In turn, these inputs are processed by the neuron 110 to determine when to "fire" an output spike, while may be transmitted as an output of the SNN or as an input to another neuron 110 in the SNN.

In an SNN, the neuron 110 does not (necessarily) produce an output at every potential time interval. Instead, the neuron 110 determines whether to produce an output spike based on the previously provided inputs. These inputs may decay over time such that a sufficient number and/or strength of inputs need to be received within a given time period to overcome the action potential of the neuron 110 for the neuron 110 to produce an output spike for downstream consumption. Accordingly, the inputs received by a given neuron 110, which may be received from input sources 120 that include other neurons 110, are received at various times according to when the action potentials from those other neurons 110 are satisfied.

Because the neuron 110 can accept inputs sent at different times from the input sources 120, and the input sources 120 do not (necessarily) send a signal to the neuron 110 at every potential time interval, the neuron 110 can receive several inputs over a shared path between the input sources 120 and the neuron 110 at different times. By using one (or at least fewer) signal paths to provide inputs from the input sources 120 to the neuron 110, less hardware, less power, and less space on the integrated circuit defining the neuron 110 can be used compared to implementations that use dedicated signal paths provisioned between each input source 120 and the neuron 110. For example, on an integrated circuit with ten neurons 110 configured to receive inputs from ten input sources 120, one hundred signal paths would need to be implemented if dedicated signal paths were used, compared to only ten signal paths according to the present disclosure.

Figure 2:
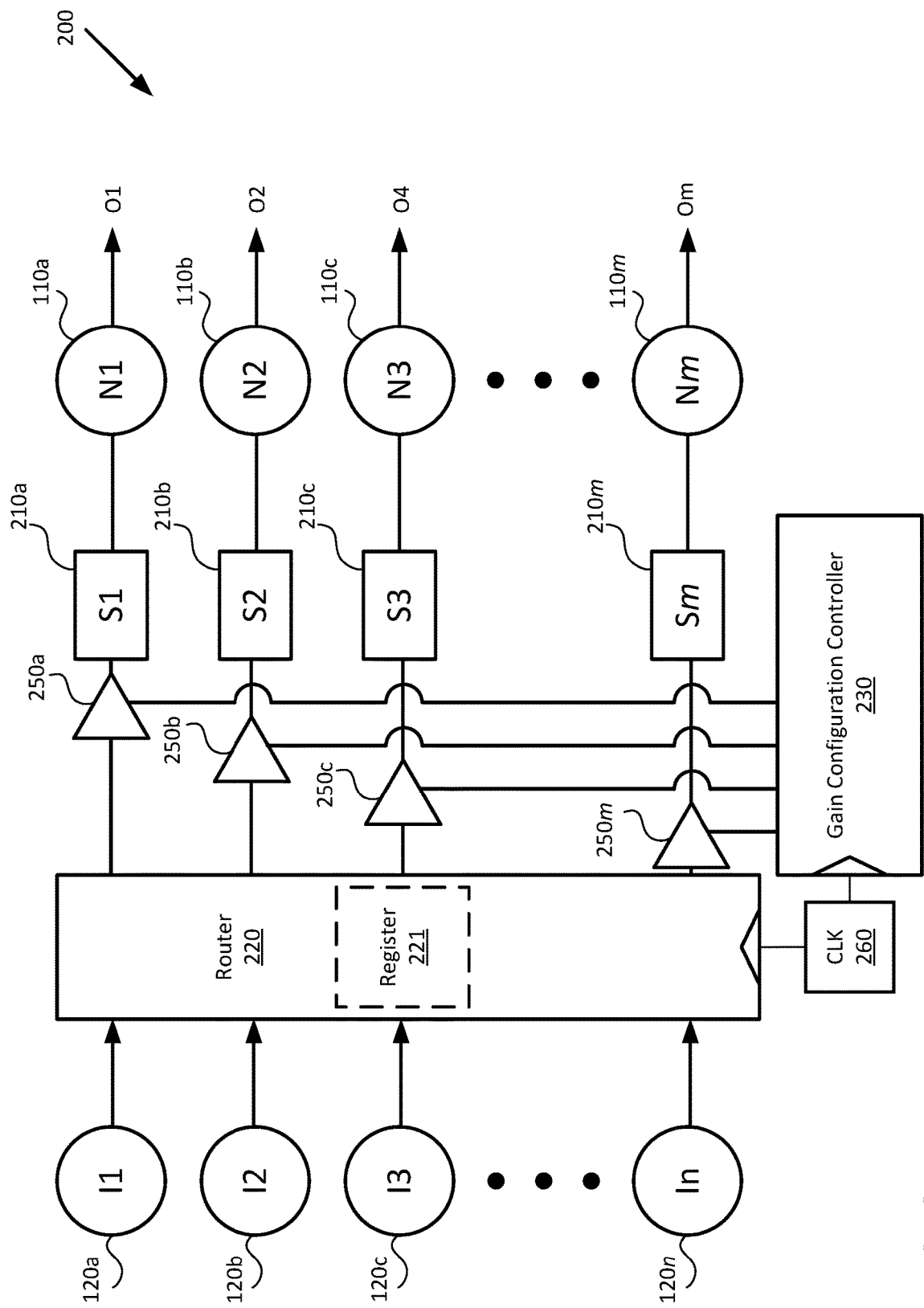
FIG. 2 illustrates an example integrated circuit layout to manage several neurons to receive input from several input sources via one corresponding synapse for each of the neurons, according to embodiments of the present disclosure.

FIG. 2 illustrates an example integrated circuit layout 200 to manage up to m neurons 110a-m to receive input from up to n input sources 120a-n via one corresponding synapse 210a-m (generally, synapse 210) for each of the m neurons 100a-m, according to embodiments of the present disclosure. Example circuitry of a synapse 210 is discussed in greater detail with regard to FIGS. 5A and 5B, although other circuitry can be used in various embodiments.

In an SNN, not every neuron 110 in one layer is necessarily connected to every neuron 110 in a subsequent layer, and instead, a router 220 is included to link particular input sources 120 with particular neurons 110. Included on each signal path leading into the neurons 110a-m from the router 220 are a corresponding variable gain amplifier 250a-m (generally, amplifier 250) and synapse 210a-m. In various embodiments, the amplifiers 250 and the synapses 210 may be included on the corresponding signal path in the illustrated order or in the reverse order (e.g., with the synapse 210 upstream or downstream from the associated amplifier 250). In various embodiments, the router 220 in configured to link or connect one or more of the input sources 120a-n to one or more of the neurons 110a-m based on a training phase of the SNN that identifies which input sources 120 and neurons 110 are to be linked, which may be adjusted after any iteration of SNN training.

In some embodiments, based on the configuration of the SNN, not all neurons 110 receive inputs from all of the input sources 120, but the router 220 can connect any particular input source 120 to any particular neuron 110, and can connect one or more input sources 120 to one neuron 110 over one signal path. For example, at time $t_1$ both a first input source 120a and a second input source 120b may transmit a respective first spike and second spike. In this example, the router 220 connects a first neuron 110a with the first input source 120a and a second neuron 110b with the second input source 120b, but does not connect the first neuron 110a with the second input source 120b or the second neuron 110b with the first input source 120a. Accordingly, the router 220 allows for multiple neurons 110a to receive spikes from disparate inputs sources 120 without the spikes colliding. In contrast, if the router 220 linked the first neuron 110a with the first input source 120a and the second input source 120b in the above example, the two spikes would collide, and the first neuron 110a may lose definition of where an input was received from and how to handle such an input. However, the router 220 may connect various other input sources 120 with the first neuron 110a when those other input sources 120 are not predicted (or permitted) to transmit spikes at the same time as one another or are otherwise time-separated to avoid colliding transmitted spikes. For example, the router 220 may connect the first neuron 110a with n different input sources 120a-n when each is constrained to transmit within an individual time division of a time period, when the router 220 caches the spikes for time divided re-transmittal, etc.

In various embodiments, the router 220 is driven according to a clock signal 260 to change how the various input sources 120 are linked to the various neurons 110 at various times. For example, at time $t_0$ the router 220 can connect a first input source 120a to a first neuron 110a and to a second neuron 110b, but not to a third neuron 110c. At a later time $t_1$, the router 220 can connect a second input source 120b to the first neuron 110a, the second neuron 110b, and the third neuron 110c. In such embodiments, the router 220 ensures that although several input sources 120 can be connected to each individual neuron 110 at different times, at no time is more than one input source 120 connected to a given neuron 110. Additionally, the router 220 can change which neurons 110 can receive inputs at a given time. Accordingly, the router 220 can establish or break connections between the various neurons 110 and input sources 120 according to a time division schema to prevent spikes generated outside of an assigned time window from separate input sources 120 from colliding over a shared signal path for a given neuron 110.

In some embodiments, the router 220 receives input spikes from every input source 120a-n and re-transmits the input spikes to all of the neurons 110a-m after identifying the input source 120 from which the input spikes were received. Based on the identity of the input source 120, each neuron 110a-m receives the input spike according to an independently tuned gain for that input source 120 (including gains that block or otherwise cause the input spike to fall below a reception threshold—effectively causing the neuron 110 to not receive the input spike). The independently tuned gains are based off of the weights learned by the neurons 110 for input spikes from the various input sources 120 during a training or learning phase of the SNN.

In various embodiments, the router 220 includes an optional register 221 to receive and hold spikes received from the input sources 120 for transmission to the neurons 110 at a designated time division in a time division schema. For example, in a time division schema using a time period of one second (s), the register 221 can hold any input received in that 1 s time period and transmit the stored spike at a designated time division within the time period. The register 221 can include separate memory units for each input source 120 to hold and then re-transmit a spike received from an individual input source 120 to the linked neurons 110. In some embodiments, the register 221 is driven according to a clock signal 260 to determine when to re-transmit spikes stored in memory, at which time the register 221 clears or zeroes out the memory to allow the memory to contain (or not contain) a spike based on whether an associated input source 120 sends another spike in the next time period.

Additionally, the register 221 can help avoid collisions over the signal paths from multiple input sources 120. For example, if two (or more) input spikes are received at the same time $t_0$ from separate input sources 120, each spike may be held in separate sections of the register 221 associated with each input source 120 to be re-transmitted to the destination neurons 110 at separate times (e.g., a first input spike at time $t_1$ and the second input spike at time $t_2$). In another example, if two (or more) input spikes are received at the same time $t_0$ from separate input sources 120, one spike may be re-transmitted or allowed to transmit to the destination neurons 110 at the time of reception $t_0$, while the other input spike(s) is held in the register 221 for re-transmission at a later time. In some embodiments, the register 221 can combine multiple signals received during a time period from one input source 120 to provide an amplified spike to the signal path. For example, if individual spikes are transmitted from the input sources 120 at an amplitude of X, and one input source 120 transmits two spikes within the time period, the register 221 can hold and re-transmit the spike with a value of 2X in the next time division associated with that input source 120.

A gain configuration controller 230 controls what gain the individual variable gain amplifiers 250a-m apply on the associated signal paths at a given time based on the time division schema.

In some embodiments, for example, a first amplifier 250a can apply a gain of X at time $t_x$, a gain of Y at time $t_{x+1}$ a gain of Z at time $t_{x+2}$, and repeat the pattern every three time divisions (e.g., X at time $t_{2x}$, Y at time $t_{2x+1}$, Z at time $t_{2x+2}$). The second through $m^{th}$ amplifiers 250-m apply various gains independently of the first amplifier 250a based how the corresponding neurons 110 have been trained in the SNN. The clock signal 260 drives the gain configuration controller 230 to change the gains applied to the amplifiers 250a-m at different time divisions in the time division schema. In various embodiments in which the router 220 receives the clock signal 260, the router 220 and the gain configuration controller 230 are driven by the same clock signal 260, thus ensuring that the gains and input spikes are received and amplified in sync with one another.

In some embodiments, a clock signal 260, and by extension the gain configuration controller 230 (and optionally the router 220), controls time division multiplexing of the signal path between the router 220 and the neurons 110. Time division multiplexing exploits the nature of the SNN, in which spikes are received infrequently from the input sources 120; an input source 120 does not send a constant signal, but rather generates a spike once an action potential is satisfied and otherwise is quiescent until the next time the action potential is satisfied. Therefore, by managing the individual gains applied on the one signal path according to the clock signal, the gain configuration controller 230 ensures that the neurons 110 can reuse one set of hardware defining a synapse 210 shared with several input sources 120, and apply the correspondingly learned weight for that input source 120.

In some embodiments, the router 220 generates the clock signal 260 based on an identity of the input source 120 from which a spike is received, which controls the gain configuration controller 230 (and by extension the amplifiers 250) in an arbitrarily divided time division multiplexing scheme. For example, instead of entering into a new time division every X milliseconds (ms), the router 220 can signal the gain configuration controller 230 to set the gains for the amplifiers 250 to the gain associated with the first input source 120a when an input spike is received from the first input source 120a. Similarly, in response to determining that the input spike is from the second input source 120b, the gain configuration controller 230 sets the gain of the associated amplifiers 250 the gain associated with the second input source 120b, etc. Accordingly, the signal paths are multiplexed based on the received input spikes and configured to reuse synaptic hardware (e.g., the amplifiers 250, synapses 210, and traces) at different times for different input sources 120.

FIGS. 3A-3E illustrate various spike transmissions 300a-e at various times, according to embodiments of the present disclosure. The gain configuration controller 230 is trained, as part of the learning phase of the SNN in conjunction with the neurons 110 to set the gain of the amplifiers 250 uniquely to reflect the trained weight that a synapse 210 carries for the corresponding neuron 110 for the associated input source 120.

Figure 3A:
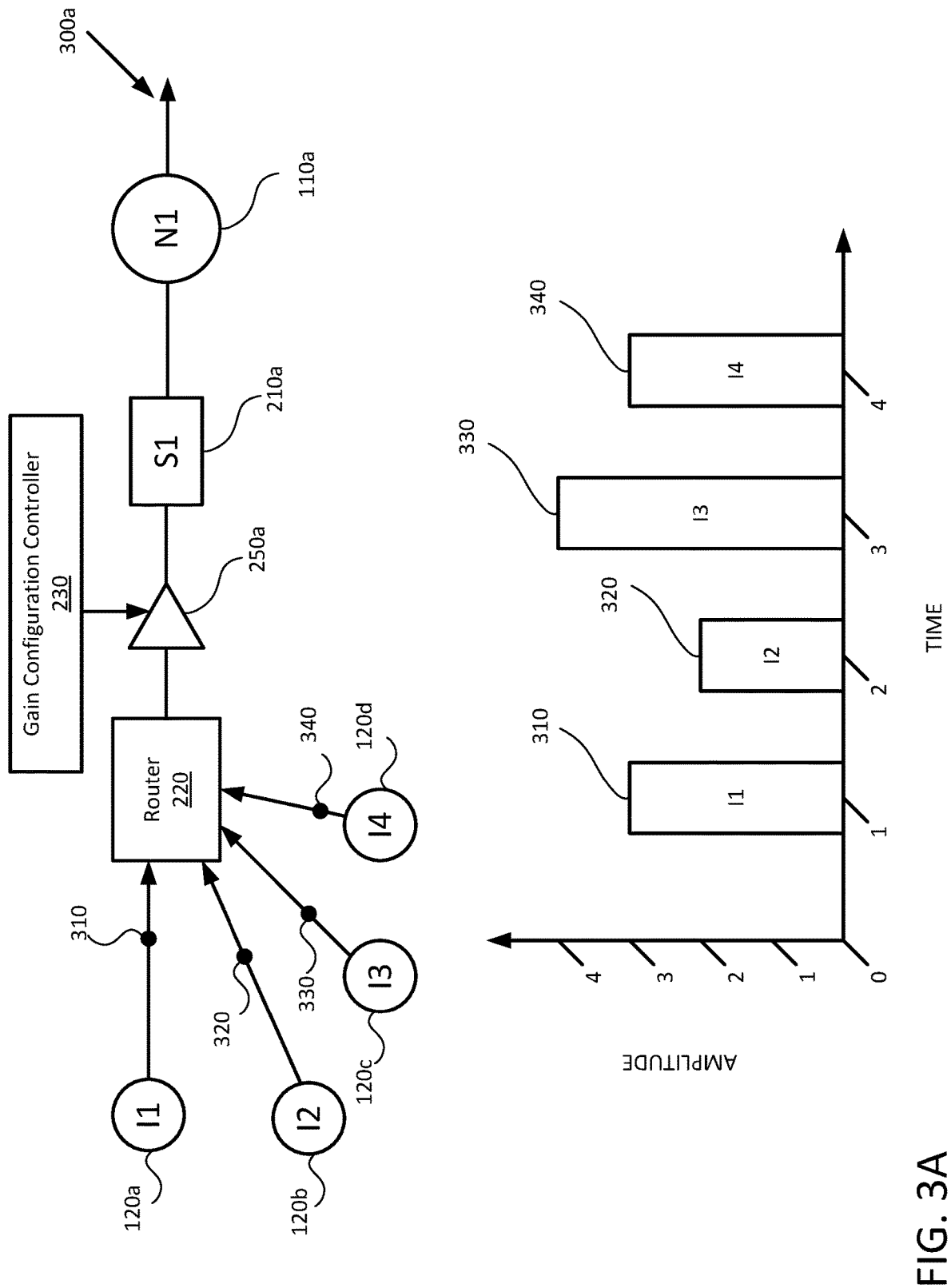
FIGS. 3A-3E illustrate various spike transmissions at various times, according to embodiments of the present disclosure.

Consider, for example, the first spike transmissions 300a of a first amplifier 250a in FIG. 3A. In FIG. 3A, a first spike 310 is received at time $t_1$ from the first input source 120a, and the first amplifier 250a applies a first gain to the first spike 310 to output the first spike at an amplitude of 3. Similarly, the amplifier 250 amplifies the second spike 320 from a second input source 120b at time $t_2$, the third spike 330 from a third input source 120c at time $t_3$, and the fourth spike 340 from a fourth input source 120d at time $t_4$ to reflect the associated gain for the input source 120 from which that spike is received. As shown, the amplifier 250 amplifies the second spike 320 to have an amplitude of 2, the third spike 330 to have an amplitude of 4, and the fourth spike 340 to have an amplitude of 3. The amplifier 250 may be set for the associated gains based on the time (e.g., as controlled by a clock-signal-driven gain configuration controller 230) being associated with a given input source 120, or based on the identity of the input source 120 (e.g., as determined at the router 220). As illustrated, the first amplifier 250a can apply several different weights, but may apply the same weight at different times/for different input sources 120 when the learned weight is the same (e.g., the first spike 310 and the fourth spike 340).

Figure 3B:
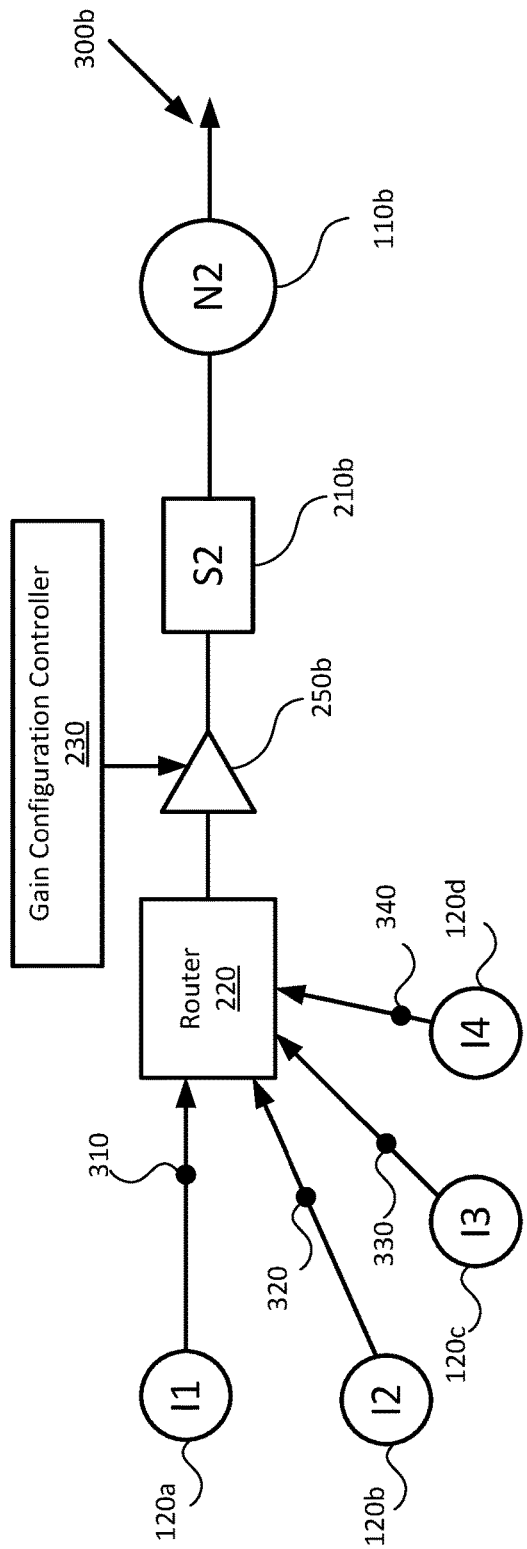
Figure 3B:
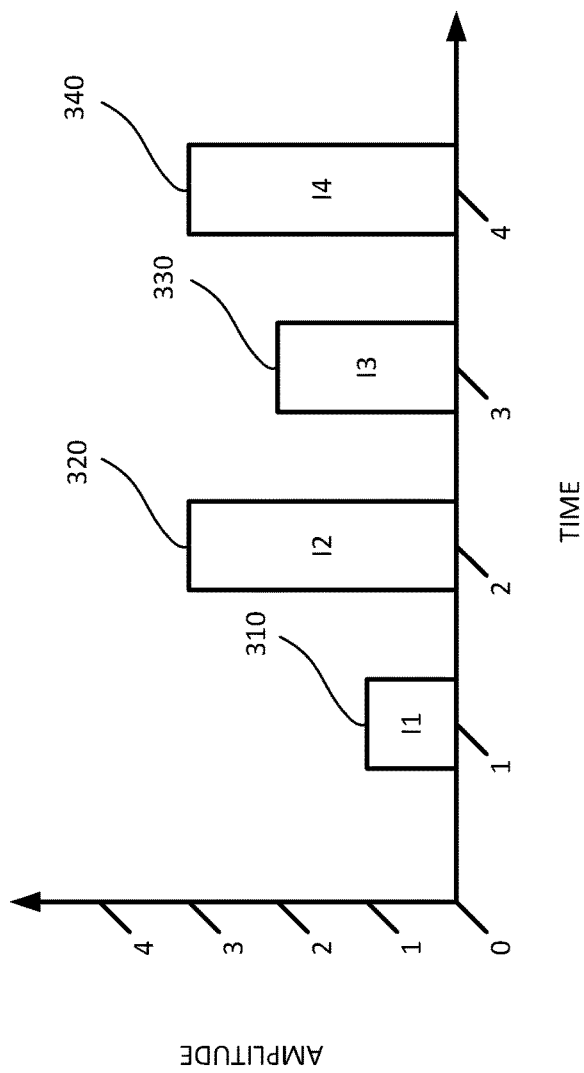

FIG. 3B illustrates second spike transmissions 300b for a second amplifier 250b, which may be amplified at the same times $t_1$-$t_4$ as the first spike transmissions 300a illustrated in FIG. 3A. Because the second amplifier 250b is associated with a different synapse 210 and neuron 110 than the first amplifier 250a (i.e., the second synapse 210b and second neuron 110b rather than the first synapse 210a and first neuron 110a), the second amplifier 250b is independently controlled to apply the learned gains for the second neuron 110b to the input spikes. Accordingly, despite receiving spikes from the same input sources 120, the gains applied thereto can be different—as indicated by the different amplitudes of the first spike 330a, second spike 330b, and third spike 330c in FIGS. 3A and 3B. However, the training of the SNN can impart the same gain for the same input source 120 at different amplifiers 250, such as, for example, the gains applied to spikes from the fourth input source 120d in FIGS. 3A and 3B, which both result in an amplitude of 3 for the respective fourth spike 340.

Figure 3C:
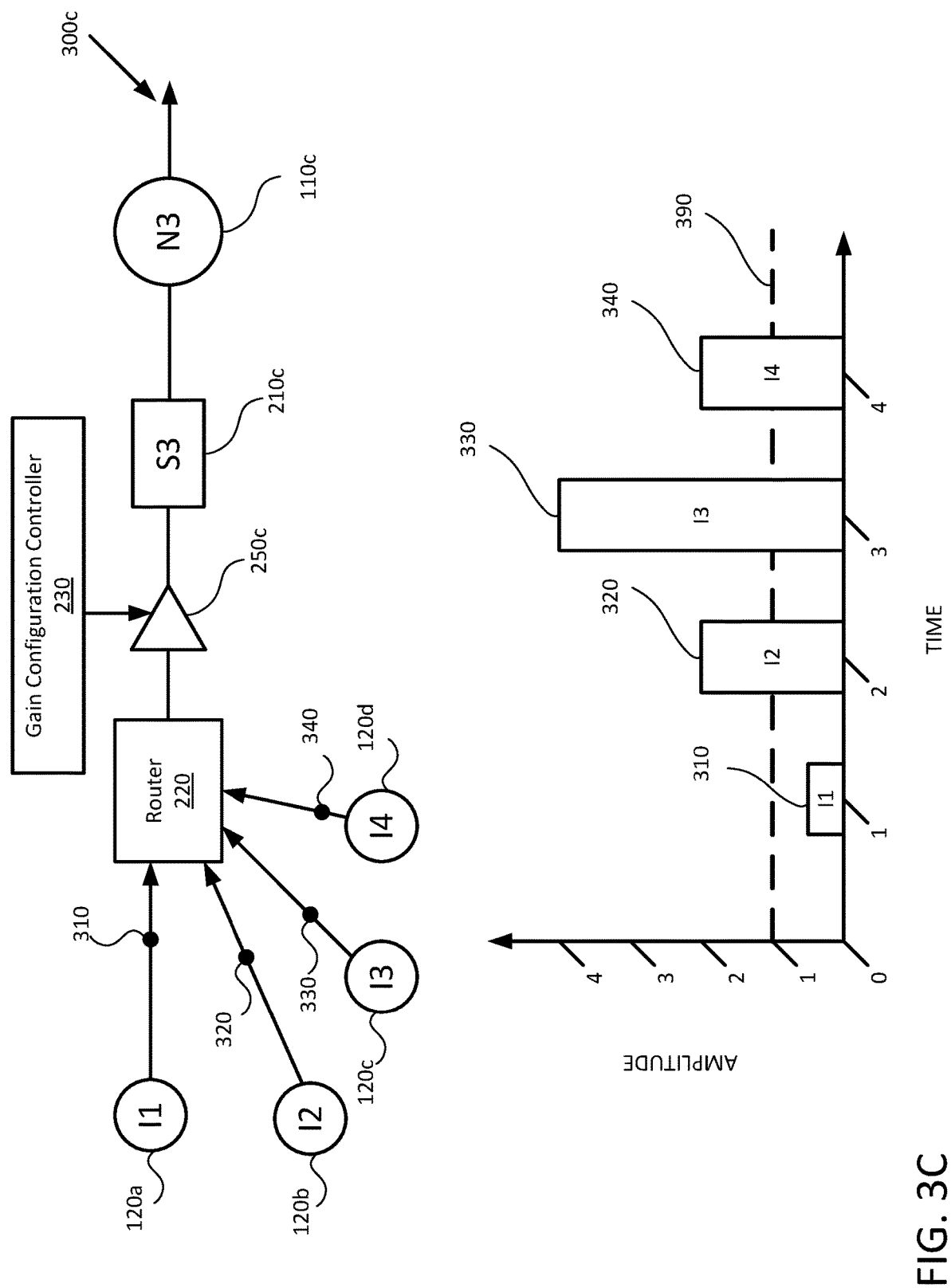

FIG. 3C illustrates third spike transmissions 300c for a third amplifier 250c, which may be amplified at the same times $t_1$-$t_4$ as the first spike transmissions 300a illustrated in FIG. 3A. In various embodiments, an amplifier 250c may be tuned to a gain below a reception threshold 390 for the associated synapse 210 for one or more input sources 120. For example, the third amplifier 250c is trained to apply no gain or a gain below a reception threshold 390 of an amplitude of 1 for the first time division at time $t_1$ or for the first input source 120a. Accordingly, the third neuron 110c effectively does not receive the first spike 310 due to the amplitude of the first spike 310 being less than the reception threshold 390.

Figure 3D:
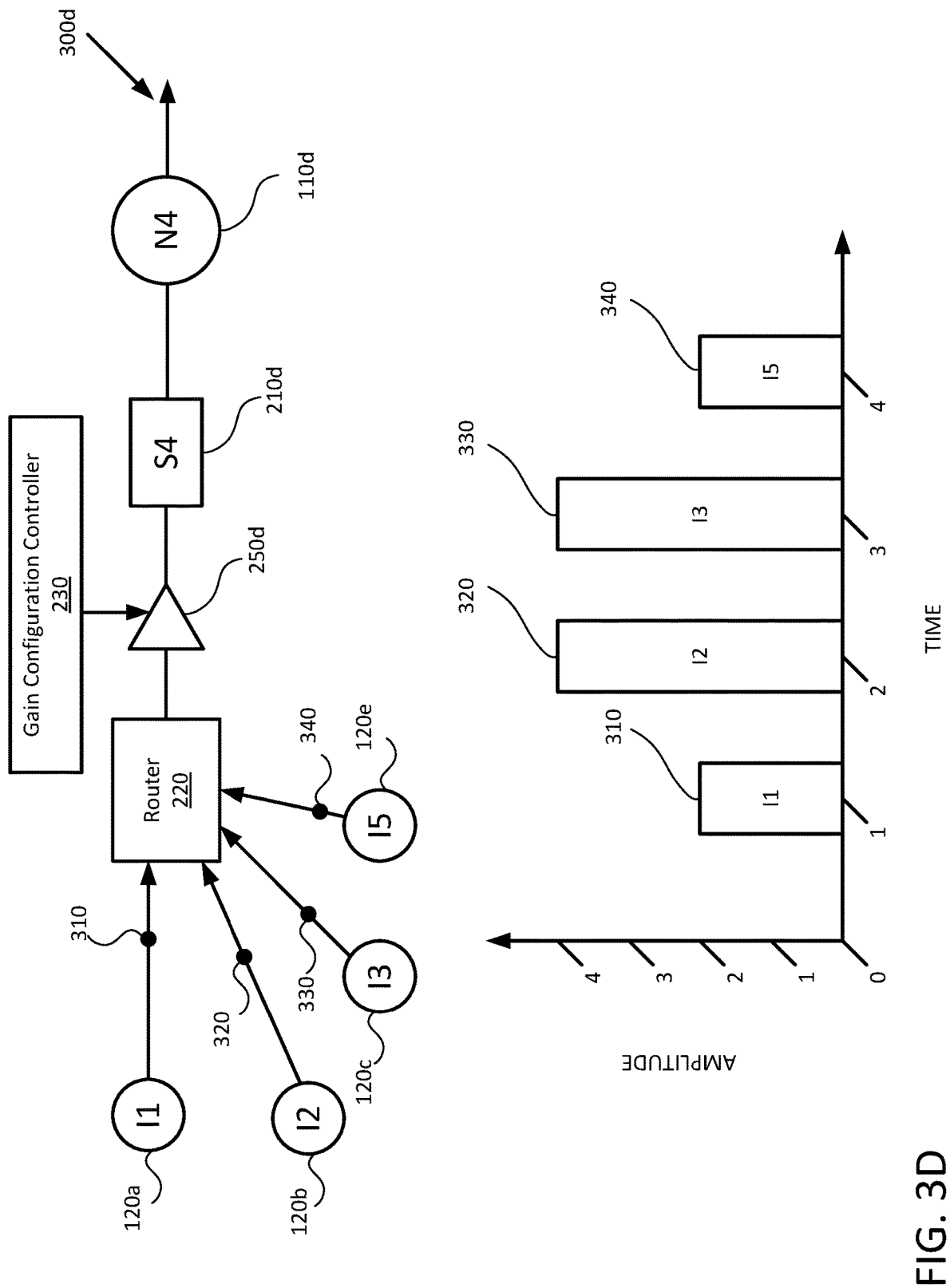

FIG. 3D illustrates fourth spike transmissions 300d for a fourth amplifier 250d, which may be amplified at the same times $t_1$-$t_4$ as the first spike transmissions 300a illustrated in FIG. 3A. In various embodiments, the router 220 can link different input sources 120 (and different numbers thereof) to different synapses 210 at the same time. For example, the fourth synapse 210d (corresponding to the fourth amplifier 250d and fourth neuron 110d) is linked to the first input source 120a, the second input source 120b, and the third input source 120c, as is the first synapse 210a illustrated in FIG. 3A. However, the first synapse 210a in FIG. 3A is also linked to the fourth input source 120d, while the fourth synapse 210d is not. Similarly, the fourth synapse 210d is linked to the fifth input source 120e, while the first synapse 210a is not. Accordingly, at time $t_4$, the first synapse 210a and the fourth synapse 210d receive inputs from different input sources 120 in the illustrated examples.

Figure 3E:
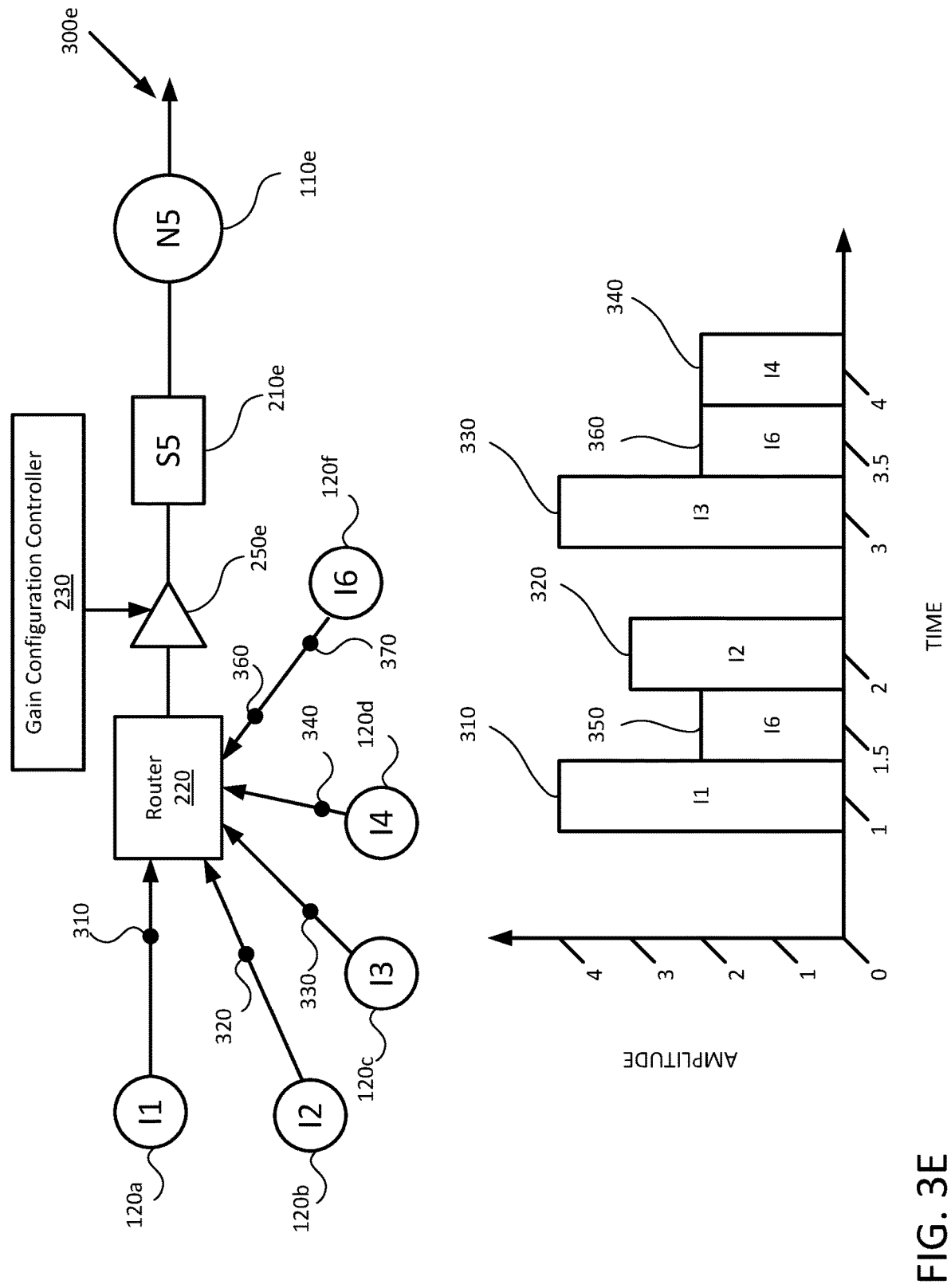

FIG. 3E illustrates fifth spike transmissions 300e for a fifth amplifier 250e, which may be amplified over the same times $t_1$-$t_4$ as the first spike transmissions 300a illustrated in FIG. 3A, but at a different rate. For example, the fifth amplifier 250e can receive and amplify input spikes from the first through fourth input sources 120a-d similarly to the first amplifier 250a in FIG. 3A, but also receive and amplify input spikes from a sixth input source 120f received at a different rate or frequency that the first through fourth input spikes 310-340. As shown, the fifth amplifier 250e applies the same gain (for an amplitude of 2) to both the fifth input spike 350 and the sixth input spike 360 because both are received from the same input source 120 (i.e., the sixth input source 120f). The sixth input source 120f generates input spikes at a different rate than the other illustrated input sources 120, which the router 220 and gain configuration controller 230 handle to apply the associated gain at the associated time and avoid collisions on the single input signal path for the fifth neuron 110e.

Figure 4A:
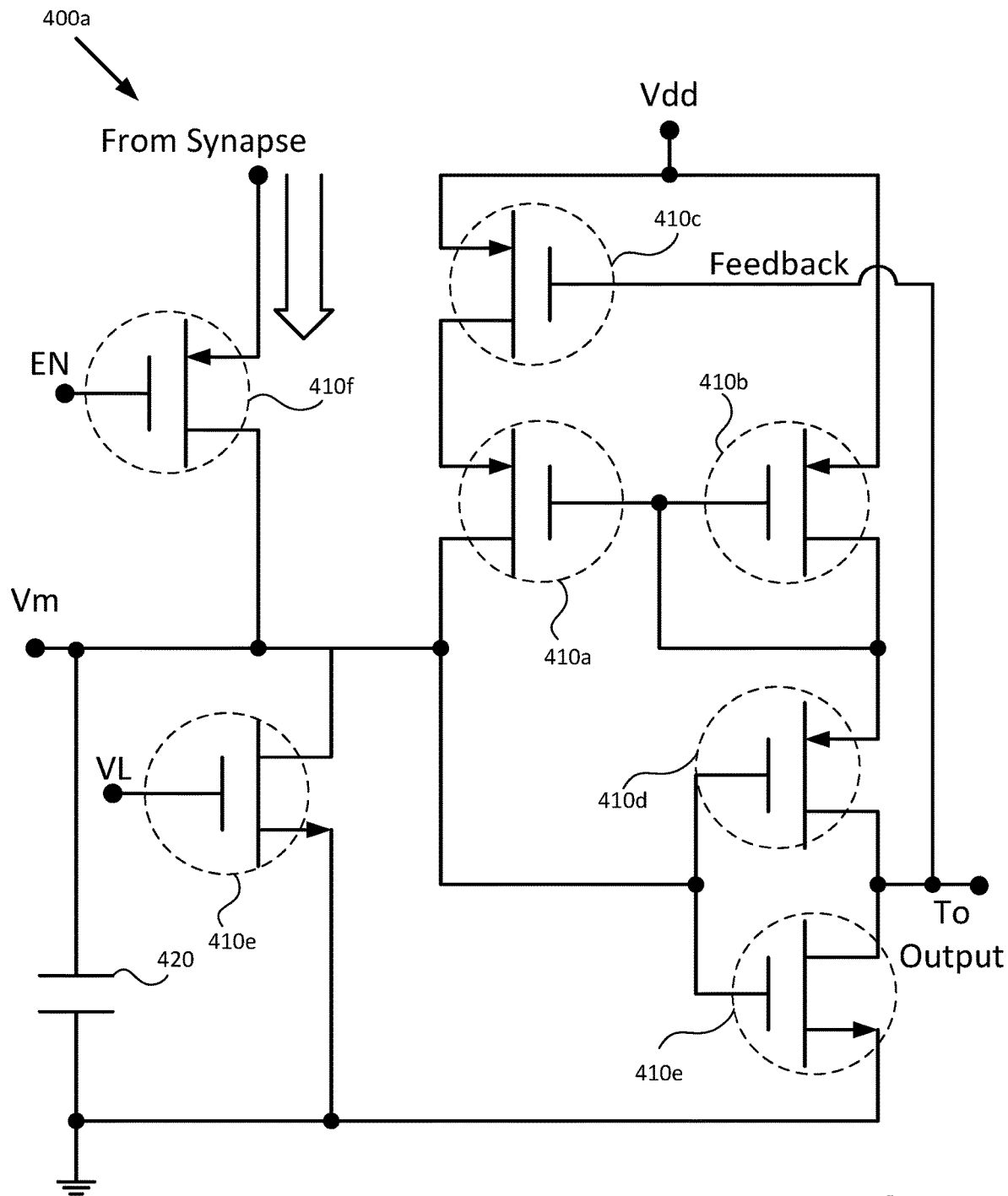
FIGS. 4A and 4B illustrate circuits for artificial neurons, according to embodiments of the present disclosure.
Figure 4B:
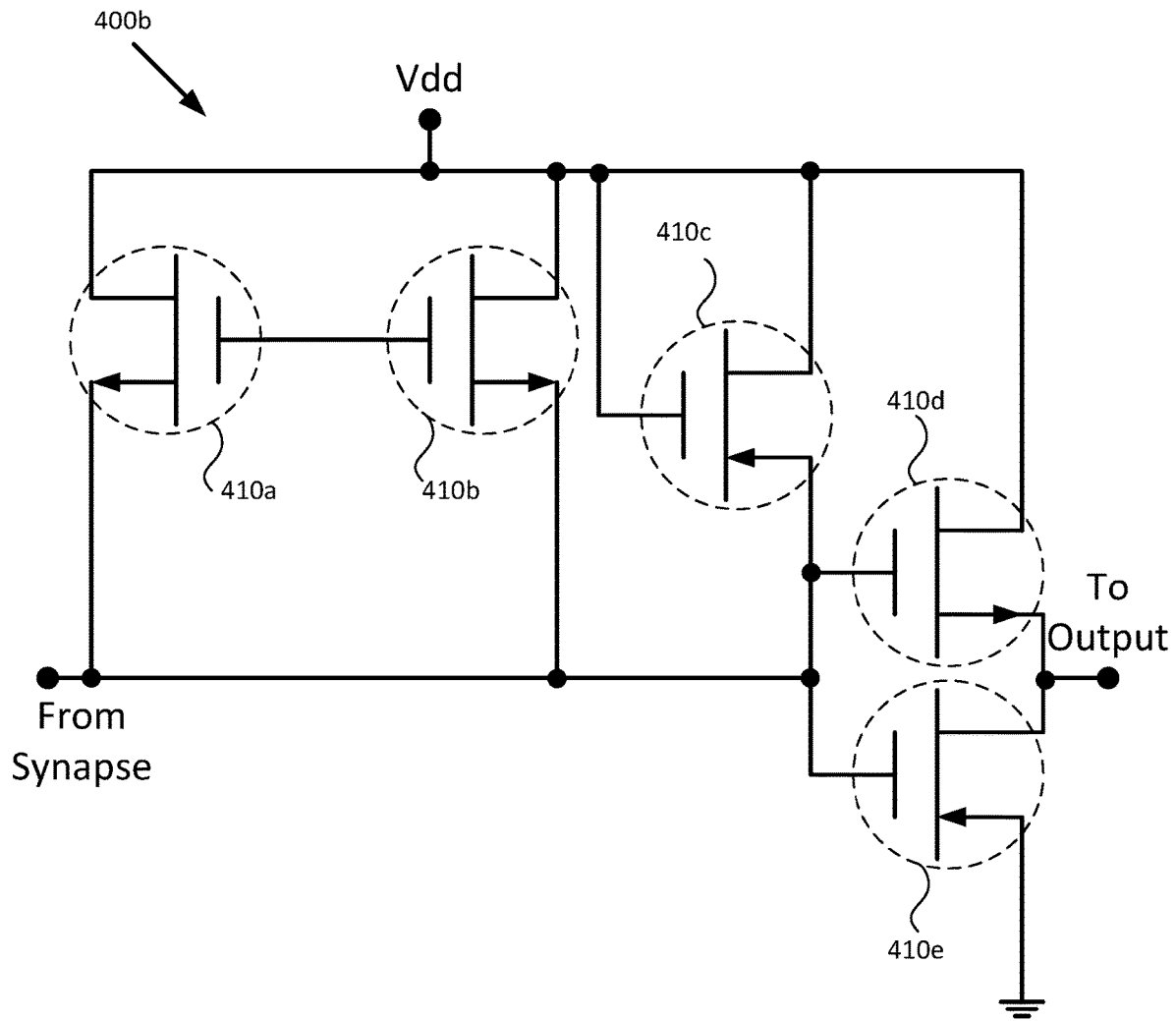

FIG. 4A illustrates one circuit for an artificial neuron 400a (generally, artificial neuron 400) and FIG. 4B illustrates another circuit for an artificial neuron 400b, as may be used as a neuron 110, according to embodiments of the present disclosure. As will be appreciated, other circuitry than the artificial neurons 400 illustrated in FIGS. 4A and 4B may be used as a neuron 110 in various embodiments of the present disclosure; the artificial neurons 400 is provided as non-limiting examples of circuit components and configurations suitable for use as a neuron 110.

In FIG. 4A, a first transistor 410a (generally, transistor 410) and a second transistor 410b (both illustrated as p-channel) define a current mirror, receiving feedback from a third transistor 410c connected to an invertor formed from a fourth transistor 410d and a fifth transistor 410e that generate an output for the artificial neuron 400a when an activation potential is satisfied. A sixth transistor 410f (that is fed an enabling voltage EN at a respective gate) is provided as a summing transistor to add various input spikes from the corresponding synapse 210 over time. Additionally, a seventh transistor 410g (that is fed a leakage voltage $V_L$ at a respective gate) and a capacitor 420 are provided to "leak" the summed voltage from the input spikes over time so that the level of summed input decays over time. Leakage advantageously allows the neuron 110 to "forget" that an input was received so that both the strength and/or frequency at which inputs are received are taken into account when determining whether to produce an output spike. Feedback advantageously allows the neuron 110 to "reset" once an output spike is generated; requiring a new set of input spikes of sufficient strength and/or frequency to generate a subsequent output spike.

In FIG. 4B, the artificial neuron 400b includes a current mirror circuit, a summing circuit, and an invertor circuit. The current mirror circuit includes a first transistor 410a and a second transistor 410b (both illustrated as p-channel) connected to one another's gates. The drain of the first and second transistor 410a,b are connected to an input from a corresponding synapse 210. A third transistor 410c (illustrated as n-channel) is provided as a pull-up transistor to add the input spikes from the corresponding synapse 210 received over time. A fourth transistor 410d (illustrated as p-channel) and a fifth transistor 410e (illustrated as n-channel) form an invertor, which generates an output for the artificial neuron 400a when an activation potential is satisfied. Advantageously over neurons 110 including leakage and feedback circuitry, the artificial neuron 400b requires fewer circuit components (and correspondingly less space to fabricate and power to operate) and is time independent; and is thus able to use input receiver over longer periods of time to generate an output spike compared to "leaky" neurons 110 that can "forget" inputs over a period of time.

Figure 5A:
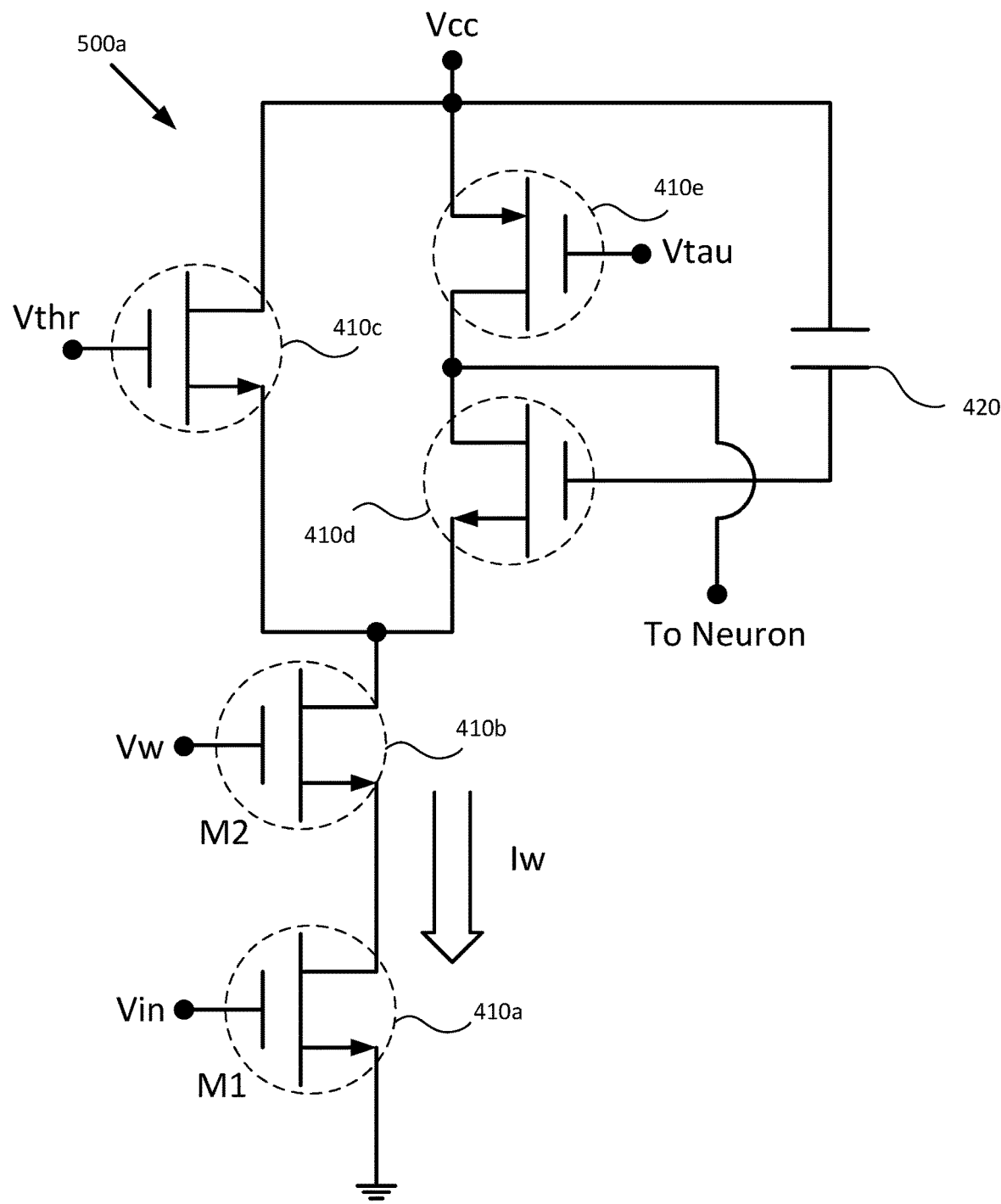
FIGS. 5A and 5B illustrate circuits for artificial synapses, according to embodiments of the present disclosure.
Figure 5B:
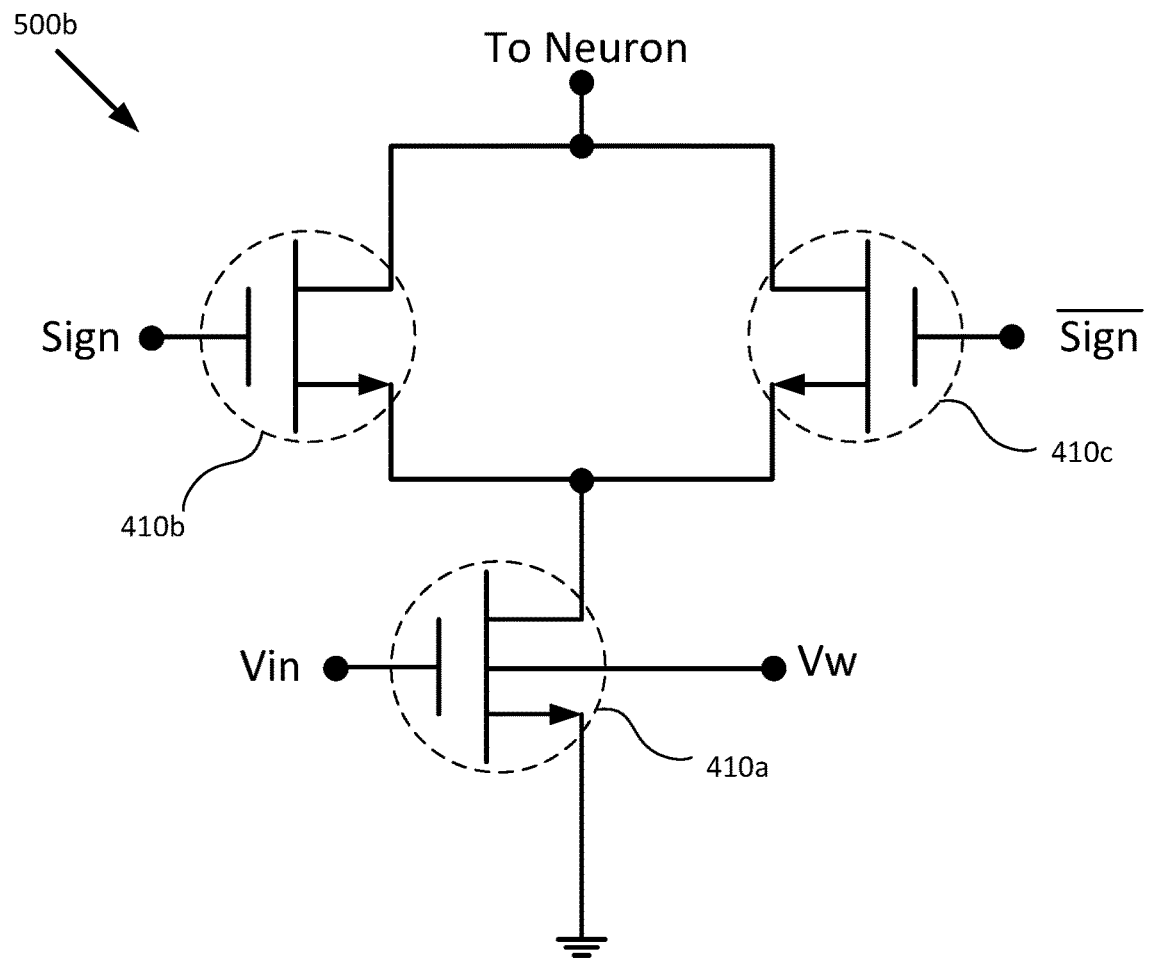

FIG. 5A illustrates one circuit for an artificial synapse 500a (generally, artificial synapse 500), and FIG. 5B illustrates another circuit of an artificial synapse 500b, as may be used as a synapse 210, according to embodiments of the present disclosure. As will be appreciated, other circuitry than the artificial synapses 500 illustrated in FIGS. 5A and 5B may be used as a synapse 210 in various embodiments of the present disclosure; the artificial synapses 500 are provided as non-limiting examples of circuit components and configurations suitable for use as a synapse 210.

In FIG. 5A, a first transistor 410a is connected at a corresponding gate to the input $V_{in}$ from the router 220 or the corresponding amplifier 250, and the source of the first transistor 410a is connected to ground. A source of a second transistor 410b is connected to the drain of the first transistor 410a, and a weight input $V_w$, which may vary based on the input source 120 routed/scheduled for transmitting a spike over the artificial synapse 500a, is connected to the gate of the second transistor 410b. The respective sources of a third transistor 410c and a fourth transistor 410d are connected to the drain of the second transistor 410b. The gate of the third transistor 410c is connected to a threshold voltage $V_{thr}$ input for a threshold level for the artificial synapse 500a, and the source of the third transistor 410c is connected to a rail carrying a collector voltage $V_{cc}$. The gate of the fourth transistor 410d is connected to the rail carrying the collector voltage $V_{cc}$ via a capacitor 420. A fifth transistor 410e is connected to the rail carrying the collector voltage $V_{cc}$ and the drain of the fourth transistor 410d by a corresponding source and drain respectively and is connected at a gate to a voltage $V_{tau}$. An output from the artificial synapse 500a shares a node with the drains of the fourth and fifth transistors 410d,e to carry an input to the corresponding neuron 110 in response to the action potential of the artificial synapse 500a being satisfied by the input $V_{in}$.

In FIG. 5B, a first transistor 410a is connected at a corresponding gate to the input $V_{in}$ from the router 220 or the corresponding amplifier 250, and the source of the first transistor 410a is connected to ground. Furthermore, the body of first transistor 410a is connected to a weight input $V_w$, which may vary based on the input source 120 routed/scheduled for transmitting a spike over the artificial synapse 500b in response to the action potential of the artificial synapse 500b being satisfied by the input $V_{in}$. The drains of a second transistor 410b and a third transistor 410c are connected to a rail connected to the corresponding neuron 110 as an input therefor. The gates of the second and third transistors 410b,c are connected to complementary sign inputs (e.g., sign and $\overline{sign}$ respectively). The sources of the second and third transistors 410b,c are both connected to the drain of the first transistor.

Figure 6:
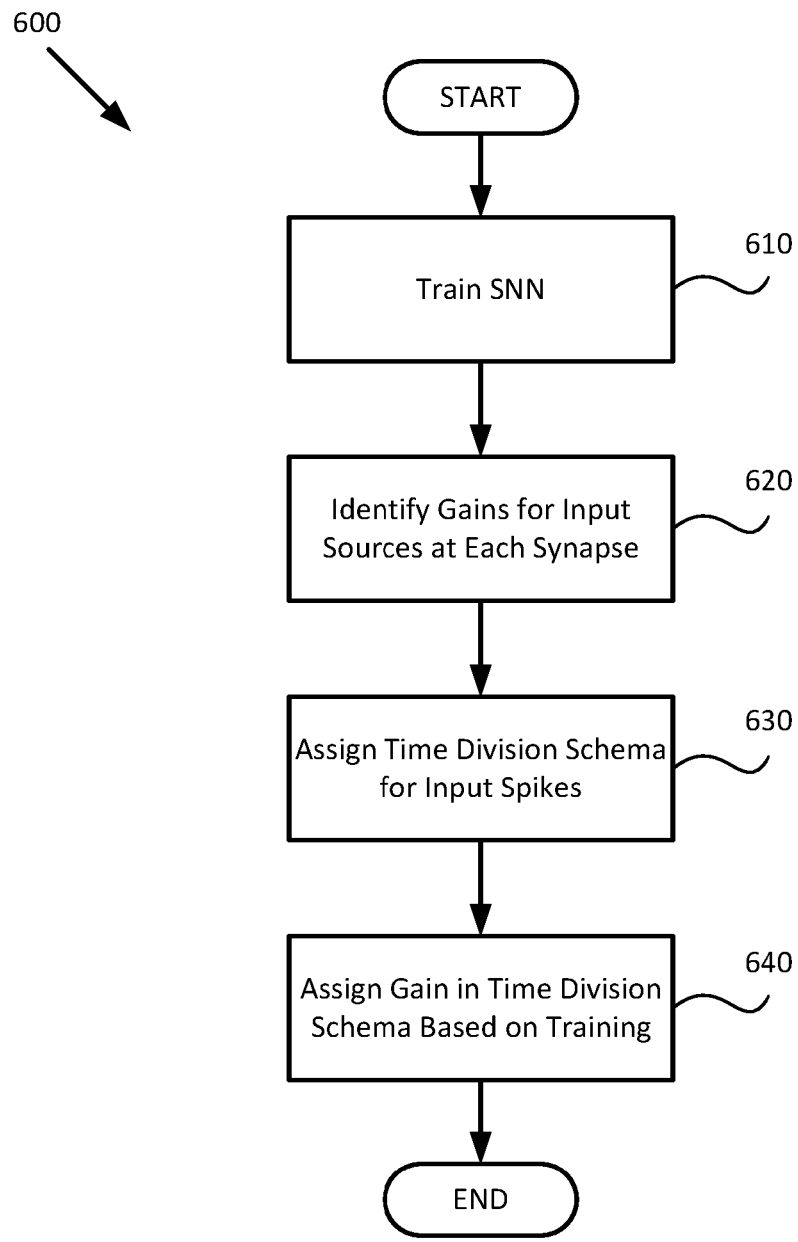
FIG. 6 is a flowchart of a method for assigning variable gains for use when reusing synapses, according to embodiments of the present disclosure.

FIG. 6 is a flowchart of a method 600 for assigning variable gains for use when reusing synapses 210, according to embodiments of the present disclosure. Method 600 begins at block 610, where an operator trains an SNN that includes several neurons 110 that each receive inputs from one corresponding synapse 210 that is re-used to carry input spikes from one or more input sources 120. The SNN may be trained over several iterations to determine what weights each neuron 110 assigns to each input source 120 according to various machine learning models.

At block 620, the operator translates the weights assigned during training by the neurons 110 to the various input sources 120 to gains for use in amplifiers 250 on the signal paths that include the reusable synapses 210.

At block 630, the operator assigns a time division schema for the input spikes to be carried over the reusable synapses 210 from various input sources 120.

In some embodiments, the time division schema assigns actual times during which signals received from the input sources 120 (e.g., at a register 221 of a router 220) are retransmitted to the neurons 110 and the amplifiers 250 are set to the corresponding gains assigned per block 620. In such embodiments, the gain configuration controller 230 and the router 220 are controlled by a shared clock signal 260 to determine when to transmit spikes from a given input source 120 stored in the register 221 and what gain to set the various amplifiers 250 to based on the time and/or the identity of the corresponding input source 120.

In some embodiments, the time division schema operates in response to receiving a spike and the identity of the input source 120 from which the spike was received. In such embodiments, the router 220 indicates to the gain configuration controller 230 the identity of the input source 120 from which the input spike is received, and the gain configuration controller 230 sets the gains of the amplifiers 250 according to that identity. The gains of the amplifiers 250 may remain thus set until a subsequent input spike is received, at which time the router 220 identifies the new input source 120 to the gain configuration controller 230, which updates the gains applied by the amplifiers 250. The identity of the input source 120 indicated by the router 220 to the gain configuration controller 230 may this also be used a clock signal 260 to signal when the gain configuration controller 230 is to change the gains that the amplifiers 250 are set to.

At block 640, the operator assigns the gains in the time division schema based on the training. In various embodiments, the gains that are to be applied to specific amplifiers 250 in response to receiving an input spike from a specific input source 120 are stored in a lookup table or other logical structure in the gain configuration controller 230. Method 600 may then conclude.

Figure 7:
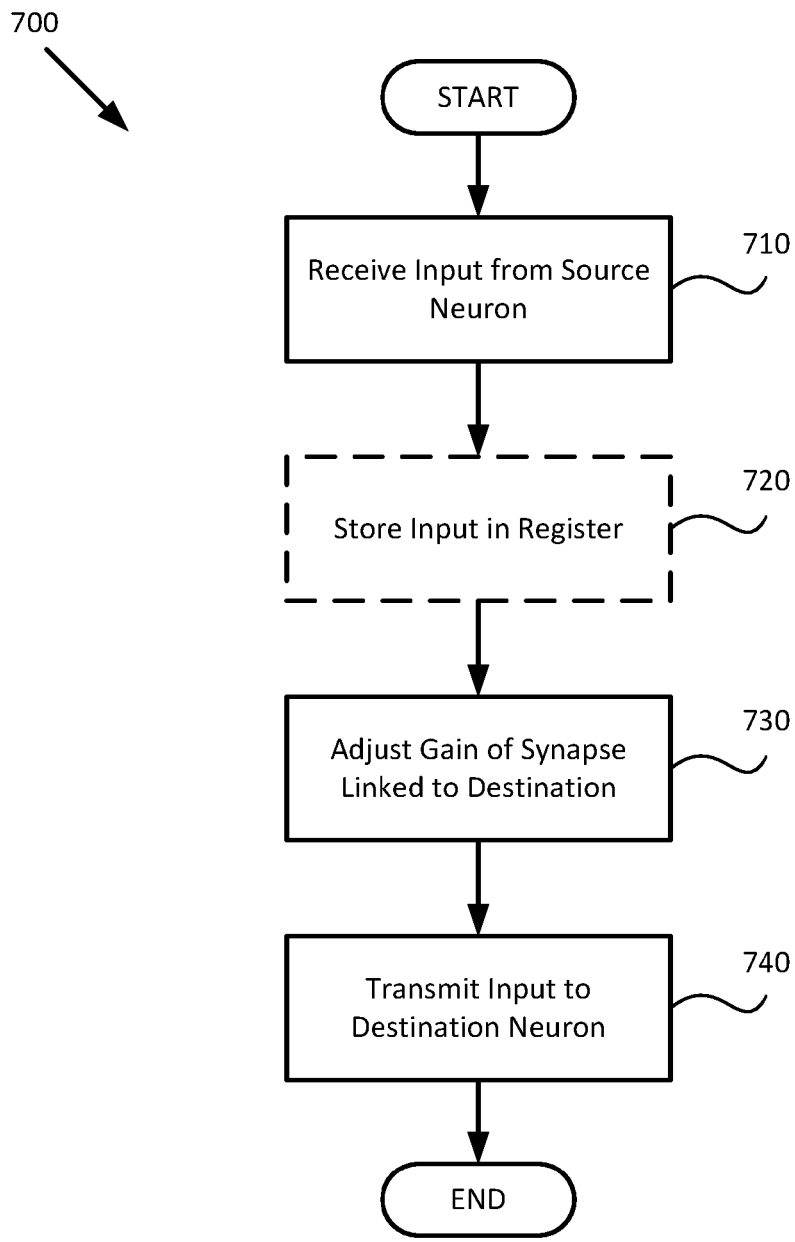
FIG. 7 is a flowchart of a method for applying variable gains for use when reusing synapses, according to embodiments of the present disclosure.

FIG. 7 is a flowchart of a method 700 for applying variable gains for use when reusing synapses, according to embodiments of the present disclosure. Method 700 begins at block 710, where the router 220 receives an input spike from a particular input source 120. The router 220 is connected to each input source 120 and to each neuron 110, but can selectively link the input sources 120 to the neurons 110 (i.e., not every neuron 110 is necessarily connected to every input source 120). In some embodiments, the router 220 cycles through which input source 120 is connected to which neurons 110 based on a clock signal 260.

Optionally, at block 720, if the router 220 includes a register 221 or other caching device to assure that the input spike is forwarded the destination neurons 110 at a predefined time according to the time division schema, or that the input spike does not collide with another input spike over the shared input paths used by each individual neuron 110. Otherwise, the router 220 may forward the input spike to the neurons 110 over the signal paths without storing the input spike in the register 221, and method 700 may proceed to block 730 without performing block 720.

At block 730, the gain configuration controller 230 adjusts the gains in the amplifiers 250 based on the input source 120 that is transmitting the input spike to the neurons 110. In various embodiments, the gain configuration controller 230 sets the gain of a first amplifier 250a (corresponding to a first neuron 110a) independently from the gain of a second amplifier 250b (corresponding to a second neuron 110b) based on the learned weight that each neuron 110 assigns to the input spikes from one input source 120. In some embodiments, when the gain configuration controller 230 sets the gain of a first amplifier 250a (corresponding to a first neuron 110a) independently from the gain of a second amplifier 250b (corresponding to a second neuron 110b) based on the router 220 linking a first input source 120a to the first neuron 110a and a second input source 120b to the second neuron 110b and the associated weights assigned by those neurons 110 to the respectively linked input sources. Accordingly, several input sources 120 can be linked over a single pathway to a given neuron 110 with varying weights applied to the input spikes, thus reducing the amount of hardware needed to represent the neural network including the given neuron 110.

At block 740, the input spike transmits to the destination neuron(s) 110. The input spike travels from the router 220 to each destination neuron 110 over a shared signal path that includes the amplifier 250 and synapse 210 corresponding to that one neuron 110. The amplifier 250 applies a learned gain to the input spike, and the synapse 210 determines whether to block or forward the input spike onward to the corresponding neuron 110. Method 700 may then conclude.

Figure 8:
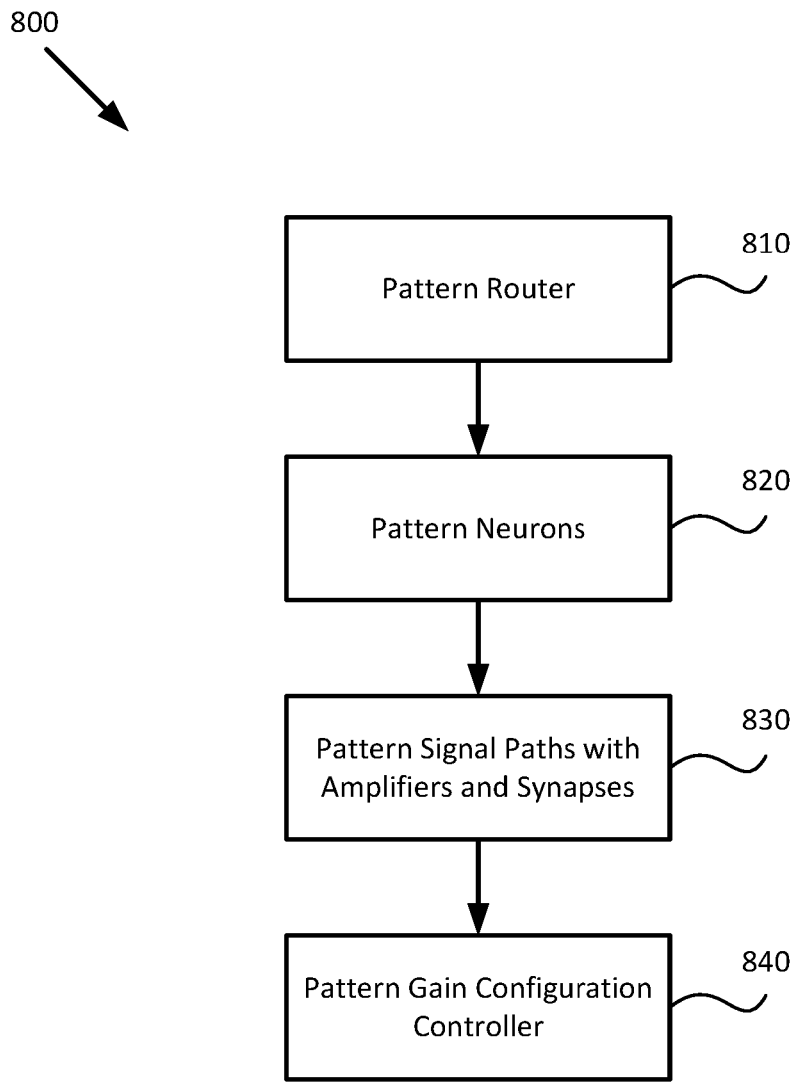
FIG. 8 is a flowchart of a method for fabricating an integrated circuit according to embodiments of the present disclosure.

FIG. 8 is a flowchart of a method 800 for fabricating an integrated circuit according to embodiments of the present disclosure. Although the blocks of method 800 are presented in a set order in FIG. 8, one of skill in the art will appreciate that circuit fabrication is often performed in layers; patterning and depositing the components of the circuit from a base or substrate layer in an additive process that may form several portions of different components on a given layer. The fabrication process may also include etching or ablative steps to remove material to define voids or regions where additional material is to be deposited in a later additive step. Therefore, the elements of method 800 can be understood to be performed at least partially in parallel and with no one element being performed first/last.

At block 810, the fabricator patterns the router 220. The router 220 connects one or more input sources 120 with one or more neurons 110 that are defined on the chip (e.g., per block 820). In various embodiments, the fabricator patterns the input sources 120 as other neurons 110 defined on the chip, or may pattern traces for off-chip neurons 110 or data sources to be input into the router 220 and thereby transmitted to the neurons 110 on the chip.

At block 820, the fabricator patterns the neurons 110. The neurons 110 include one or more transistors, and may include resistors, capacitors, and inductors to represent an algorithm or logical operation of an SNN in circuitry, including memory with the ability to decay or "forget" previous inputs over a period of time. The neurons 110 each include an output port over which an output spike is transmitted when the logical operation embodied by the neuron 110 is satisfied. In various embodiments, the neurons 110 are linked as input sources 120 to other neurons 110 on the same or a different chip.

At block 830, the fabricator patterns the signal paths between the router 220 and the neurons 110, which include amplifiers 250 and synapses 210. Each neuron 110 is associated with one signal path, which includes a corresponding amplifier 250 and one synapse 210. In various embodiments, the synapse 210 is located upstream of the amplifier 250 (i.e., further from the corresponding neuron 110 than the amplifier 250 is), but in other embodiments the synapse 210 is located downstream of the amplifier 250 (i.e., closer to the corresponding neuron 110 than the amplifier 250 is). The amplifiers 250 are controllable to provide a variable gain based on a control signal from a gain configuration controller 230. Each synapse 210 includes at least one transistor and is configured with a threshold to produce an output that is forwarded to the corresponding neuron 110 in response to an input spike received by the synapse 210 satisfying the threshold.

At block 840, the fabricator patterns the gain configuration controller 230. In various embodiments, the gain configuration controller 230 is a logical control unit or microprocessor that is connected to the amplifiers 250 and one or more of a generator for a clock signal 260 and the router 220. In various embodiments, the fabricator encodes control logic into a memory (e.g., an electrically erasable programmable read-only memory (EEPROM)) of the gain configuration controller 230 to control what gain to set each amplifier 250 to under what conditions (e.g., based on the time division schema and training of the SNN).

A fabricator may perform block 810-840 on a single chip or other Very Large Scale Integrated (VLSI) circuits, or may perform one or more of blocks 810-840 on separate chips and connect the separate chips together to form the circuit. For example, a fabricator may fabricate (or use a second fabricator) the gain configuration controller 230 separately from the other components, and perform block 840 by integrating the gain configuration controller 230 with the other components.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A circuit, comprising:
  a plurality of artificial neurons;
  a plurality of artificial synapses, wherein each respective artificial neuron of the plurality of artificial neurons is associated with a respective one input synapse of the plurality of artificial synapses;
  a plurality of variable gain amplifiers, wherein each of the plurality of variable gain amplifiers is associated with a corresponding one of the plurality of artificial neurons;
  a router, configured to connect a plurality of input sources to at least a first artificial neuron of the plurality of artificial neurons via a first variable gain amplifier and a first artificial synapse; and
  a gain configuration controller, configured to set a gain on at least the first variable gain amplifier based on: (i) a time division schema, (ii) the clock signal, and (iii) an identity of an input source from which a given spike is received, comprising:
    causing a first spike and a first gain, determined based at least in part on an identity of a first input source of the first spike, to be received by the first variable gain amplifier in sync to amplify the first spike, wherein the amplified first spike is received by the first artificial neuron via the first artificial synapse, causing a second spike and a second gain, determined based at least in part on an identity of a second input source of the second spike, to be received by the first variable gain amplifier in sync to amplify the second spike, wherein the amplified second spike is received by the first artificial neuron via the first artificial synapse, wherein the first and second gains are determined based at least in part on trained weight values learned, during a training phase, for the first artificial neuron with respect to the identities of the first and second input sources.

2. The circuit of claim 1, wherein a number of input sources connected to a given artificial neuron of the plurality of artificial neurons is based on the time division schema and a spike transmission rate from the plurality of input sources.

3. The circuit of claim 1, wherein the router and the gain configuration controller allow the first artificial neuron of the plurality of artificial neurons to receive the first spike from the first input source of the plurality of input sources at the first gain and a second artificial neuron of the plurality of artificial neurons to receive the first spike from the first input source of the plurality of input sources at a third gain set independently of the first gain.

4. The circuit of claim 1, wherein the router and the gain configuration controller allow the first artificial neuron of the plurality of artificial neurons to receive the first spike from the first input source of the plurality of input sources during a first time and a second artificial neuron of the plurality of artificial neurons to receive a third spike from a third input source of the plurality of input sources at the first time.

5. The circuit of claim 1, wherein the first input source of the plurality of input sources transmits spikes at a first transmission rate and the second input source of the plurality of input sources transmits spikes at a second transmission rate, different from the first transmission rate.

6. The circuit of claim 1, wherein the router includes a register, configured to receive and store input spikes from the plurality of input sources and re-transmit the input spikes from the register based on the time division schema.

7. The circuit of claim 1, wherein the router and the gain configuration controller allow the first artificial neuron of the plurality of artificial neurons to receive the first spike from the first input source of the plurality of input sources at the first gain and the first artificial neuron to receive the second spike from the second input source of the plurality of input sources at the second gain set independently of the first gain.

8. The circuit of claim 1, wherein each of the plurality of variable gain amplifiers is positioned upstream of a corresponding one artificial synapse relative to a corresponding artificial neuron.

9. The circuit of claim 1, wherein the plurality of artificial neurons, the plurality of artificial synapses, the plurality of variable gain amplifiers, the router, and the gain configuration controller are defined on a single integrated circuit.

10. A method, comprising:
training neurons in a spiking neural network (SNN);
assigning a time division schema for input sources to the neurons based on the training;
assigning gains for the neurons in the time division schema based on the training;
receiving inputs from the input sources;
generating a clock signal based on an identity of a given input source; and
setting gains for a first neuron based on the assigned gains, the clock signal, and the given input source from which a given input is received, comprising:

causing a first spike and a first gain, determined based at least in part on an identity of a first input source of the first spike, to be received in sync to amplify the first spike, wherein the amplified first spike is received by the first neuron via a first synapse, causing a second spike and a second gain, determined based at least in part on an identity of a second input source of the second spike, to be received in sync to amplify the second spike, wherein the amplified second spike is received by the first neuron via the first synapse, wherein the first and second gains are determined based at least in part on trained weight values learned, during training of the neurons in the SNN, for the first neuron with respect to identities of the first and second input sources.

11. The method of claim 10, wherein setting the gains further comprises:
setting the gains based on identities of the input sources.

12. The method of claim 10, wherein the first neuron of the neurons receives the first spike from the first input source of the input sources at the first gain, and a second neuron of the neurons receives the first spike at a third gain different from the first gain.

13. The method of claim 10, wherein the first neuron of the neurons receives the first spike from the first input source of the input sources at a first time and a second neuron of the neurons receives a third input from a third input source of the input sources at the first time.

14. The method of claim 10, further comprising:
storing the inputs received in a register until a corresponding time in the time division schema.

15. The method of claim 14, wherein setting the given gain further comprises:
setting the given gain based on the corresponding time being associated with a given input source from which the given input was received.

16. The method of claim 14, further comprising:
in response to receiving two input spikes from one input source of the input sources, dropping an earlier received input spike of the two input spikes from the one input source.

17. The method of claim 14, further comprising:
in response to receiving at least two input spikes during one time division for transmission to one neuron of the neurons, colliding the at least two input spikes.

18. A system, comprising:
a signal path comprising a variable gain amplifier;
an artificial neuron connected via the signal path to a plurality of input sources; and
a gain configuration controller configured to set a gain in a variable gain amplifier based on: (i) an identity of an input source of the plurality of input sources from which a given input spike is received by the artificial neuron at a given time, and (ii) a clock signal generated by a router, comprising:

causing a first spike and a first gain, determined based at least in part on an identity of a first input source of the first spike, to be received in sync to amplify the first spike, wherein the amplified first spike is received by the artificial neuron via the signal path, causing a second spike and a second gain, determined based at least in part on an identify of a second input source of the second spike, to be received in sync to amplify the second spike, wherein the amplified second spike is received by the artificial neuron via the signal path, and wherein the first and second gains are determined based at least in part on trained weight values learned, during a training phase, for the artificial neuron with respect to the identities of the first and second input sources.

19. The system of claim 18, further comprising:
the router, connected to the plurality of input sources and configured to connect one input source of the plurality of input sources at a time to the artificial neuron via the signal path, and generate the clock signal based on an identity of the input source.

20. The system of claim 18, further comprising:
a router, connected to the gain configuration controller and the plurality of input sources, wherein the router is configured to identify to the gain configuration controller which input source of the plurality of input sources is transmitting the input spike.

* * * * *